United States Patent [19]

Kobayashi

[11] Patent Number: 5,235,547
[45] Date of Patent: Aug. 10, 1993

[54] SEMICONDUCTOR MEMORY DEVICE WITH SENSE AMPLIFIER UNIT AS WELL AS DATA REGISTER/POINTER SHARED BETWEEN PLURAL MEMORY CELL ARRAYS

[75] Inventor: Shotaro Kobayashi, Tokyo, Japan

[73] Assignee: NEC Corporation, Tokyo, Japan

[21] Appl. No.: 786,539

[22] Filed: Nov. 1, 1991

[30] Foreign Application Priority Data

Nov. 1, 1990 [JP] Japan .................................. 2-296587

[51] Int. Cl.⁵ .............................................. G11C 7/00
[52] U.S. Cl. ...................................... 365/190; 365/202
[58] Field of Search .............................. 365/190, 202

[56] References Cited

U.S. PATENT DOCUMENTS 4,592,026  5/1986  Matsukawa et al. ............ 365/190 X
4,760,562  7/1988  Ohtani ............................. 365/190 X
5,157,631  10/1992  Shimogawa .................... 365/202 X Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A dynamic random access memory device has a plurality of memory cell arrays, a plurality of sense amplifier units associated with the plurality of memory cell arrays, and a combined unit of data registers and a pointer for serially supplying read-out data bits to a serial output data bus, wherein each sense amplifier unit is shared between two of the memory cell arrays and the combined unit is also shared between two sense amplifier units so that the dynamic random access memory device occupies a small semiconductor chip.

7 Claims, 5 Drawing Sheets

SEMICONDUCTOR MEMORY DEVICE WITH SENSE AMPLIFIER UNIT AS WELL AS DATA REGISTER/POINTER SHARED BETWEEN PLURAL MEMORY CELL ARRAYS

FIELD OF THE INVENTION

This invention relates to a dynamic random access memory device and, more particularly, to a layout of the dynamic random access memory device for decreasing peripheral circuits.

DESCRIPTION OF THE RELATED ART

A typical example of the dynamic random access memory device serially accessible is illustrated in FIG. 1, and comprises four memory cell arrays 1a, 1b, 1c and 1d each implemented by a large number of dynamic random access memory cells arranged in 256 rows and 1024 columns. Though not shown in the drawings, the dynamic random access memory cell is implemented by a series combination of a transfer transistor and a storage capacitor. The memory cell arrays 1a to 1d are associated with sense amplifier units 2a, 2b, 2c and 2d, and each of the sense amplifier units 2a to 2d has 1024 sense amplifier circuits coupled with the 1024 columns of the associated memory cell array, respectively. A combined circuit of data registers and a pointer 3a is shared between the sense amplifier units 2a and 2b as well as between the memory cell arrays 1a and 1b, and another combined circuit of data registers and a pointer 3b is also shared between the sense amplifier units 2c and 2d and, accordingly, the memory cell arrays 1c and 1d.

FIG. 2 shows the circuit arrangement of the prior art dynamic random access memory device. The dynamic random access memory cells M1a and M2a are respectively paired with the dynamic random access memory cells M1b and M2b, and are concurrently gated by word lines WL1 and WL2. The dynamic random access memory cells M1a to M2b are further coupled with bit line pairs BLP1 and BLP2, and transfer gates TR1, TR2, TR3 and TR4 are coupled between the bit line pairs BLP1 and BLP2 and the sense amplifier circuits SE1 and SE2. Namely, when one of the word lines Wl1 and WL2 allows data bits to be read out from the memory cells M1a and M2a or M1b and M2b to the associated bit line pairs in the form of small difference voltage level, the transfer gates TR1 to TR4 responsive to a gate control signal TG1 on a signal line TG1 transfer the data bits from the bit line pairs BLP1 and BLP2 to the associated sense amplifier circuits SE1 and SE2, respectively. The transfer gates TR1 to TR4 turn off to block the sense amplifier circuits SE1 and SE2 from parasitic capacitances respectively coupled with the bit line pairs BLP1 and BLP2, and the sense amplifier circuits SE1 and SE2 are activated upon coupling with sources of voltage level (not shown) through voltage lines ACT1 and ACT2. Then, the sense amplifier circuits SE1 and SE2 increase the small difference voltages respectively supplied from the bit line pairs BLP1 and BLP2, and large difference voltages take place between nodes N1a and N1b and N2a and N2b.

The sense amplifier circuits SE1 and SE2 are further coupled with the transfer gates TR5, TR6, TR7 and TR8 which in turn are coupled with data registers DR1 and DR2. The transfer gates TR5 to TR8 are responsive to a gate control signal TG2 on a signal line TG2, and transfer the data bits in the form of large difference voltage to the data registers DR1 and DR2, respectively. Namely, upon completion of the sense amplification, the gate control signal TG2 allows the transfer gates TR5 to TG8 to turn on, and the data bits are stored in the data registers DR1 and DR2, respectively. On the other hand, if write-in data bits are written into the dynamic random access memory cells M1a and M2a, or M1b and M2b, the write-in data bits stored in the data registers DR1 and DR2 are firstly transferred through the transfer gates TR5 to TR8 as well as through the transfer gates TR1 to TR4 to the bit line pairs BLP1 and BLP2, and the sense amplifier circuits SE1 and SE2 are activated so as to increase the difference voltages representative of the write-in data bits. Then, the difference voltages representative of the write-in data bits are increased, and are written into the dynamic random access memory cells M1a and M2a, or M1b and M2b.

The data registers DR1 and DR2 are respectively associated with flip-flop circuits FF1 and FF2 which form in combination one of the pointers 3a and 3b. The flip-flop circuits FF1 and FF2 are coupled in cascade, and the pointer allows transfer gates TG9, TG10, TG11 and TG12 to sequentially couple the data registers DR1 and DR2 with a serial output data bus SDB. Namely, the flip-flop circuits FF1 and FF2 coupled in cascade are responsive to a serial clock signal SC on a clock signal line SC, and cause a pair of transfer gates TG9 and TG10, or TG11 and TG12 to turn on. Then, one of the data registers DR1 and DR2 is coupled through the associated transfer gates TG9 and TF10, or TG11 and TG12 with the serial output data bus SDB, and the data bit stored therein are transferred to the serial output data bus SDB. Since the data register circuits DR1 and DR2 associated with the flip flop circuits FF1 and FF2 are shared with another memory cell array and the associated sense amplifier unit as described hereinbefore, transfer gates TG13 to TG16 are further provided for the combined circuit of data register and pointer, and the transfer gates TR5 to TR8 and the transfer gates TG13 to TG16 are complementarily shifted between on and off states.

As described hereinbefore, the memory cell arrays 1a to 1d are associated with the sense amplifier units 2a to 2d for increasing difference voltages indicative of data bits, and each sense amplifier circuit can discriminate a small difference voltage from 100 millivolt to 150 millivolt. However, if the difference voltage level is too small to be discriminated by the associated sense amplifier circuit, it is impossible to read out data bits from the dynamic random access memory cells. The small difference voltage is developed upon access to a data bit stored in a dynamic random access memory cell, and the amount of the small difference is given through proportional distribution between the capacitance of the storage capacitor and the parasitic capacitance coupled with the associated bit line. Since the parasitic capacitance is proportional to the length of the associated bit line, and the length of the associated bit line in turn is proportional to the number of the dynamic random access memory cells coupled therewith. Therefore, the small difference voltage is inversely proportional to the number of the dynamic random access memory cells. This means that the small difference voltage or the characteristics of the sense amplifier circuit set a limit to the number of the dynamic random access memory cells coupled with a single bit line. In fact, a single bit line is shared between 256 dynamic random access memory cells not only in 1 megabit random access memory device but also in 4 megabit random access memory device. As described hereinbefore, the memory cell arrays 1a to 1d are respectively associated with the sense amplifier unit 2a, 2b, 2c or 2d, and each of the combined units is shared between two sense amplifier units 2a and 2b, or 2c and 2d. The dynamic random access memory device needs to be equipped with (total number of memory cells/256) sense amplifier circuits and the combined units as many as a half of the sense amplifier circuits regardless of the total number of the dynamic random access memory cells. If the dynamic random access memory device increases the memory cells, the number of the sense amplifier circuits as well as the number of the combined units are proportionally increased, and the total occupation area is increased with the dynamic random access memory cells. This results in a large semiconductor chip and, accordingly, in reduction of production yield. Thus, the prior art layout of the dynamic random access memory device encounters a problem in large occupation area and low production yield.

SUMMARY OF THE INVENTION

It is therefore an important object of the present invention to provide a semiconductor memory device which occupies a small amount of occupation area.

To accomplish these objects, the present invention proposes to share a sense amplifier unit as well as a combined circuit of data registers and a pointer between a plurality of memory cell arrays.

In accordance with the present invention, there is provided a semiconductor memory device fabricated on a single semiconductor chip, comprising: a) a plurality of memory cell arrays each having a plurality of memory cells respectively storing data bits; b) a plurality of sense amplifier units each shared between memory cell arrays selected from the plurality of memory cell arrays, and operative to increase small difference voltages representative of data bits; and c) at least one serial data transfer means shared between sense amplifier units selected from the plurality of sense amplifier units for serially transferring the data bits between one of the associated sense amplifier units and a data buffer unit.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 3:
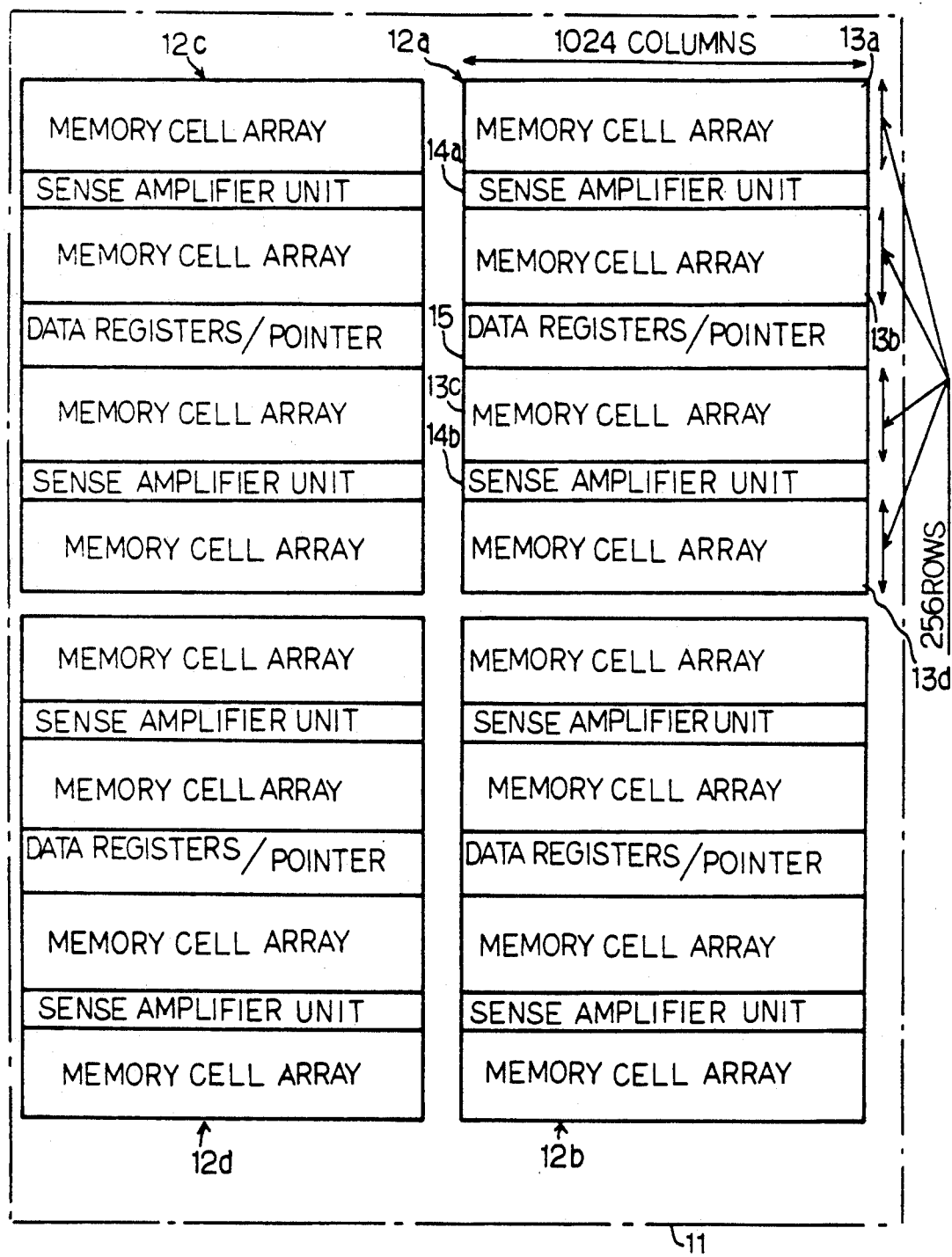
FIG. 3 is a view showing the layout of a dynamic random access memory device according to the present invention.

Referring to FIG. 3 of the drawings, a dynamic random access memory device embodying the present invention is fabricated on a single silicon chip 11, and comprises 4 memory cell array blocks 12a, 12b, 12c and 12d. However, the memory cell array blocks 12a to 12d are similar in layout as well as in arrangement to one another, and description is focused upon the memory cell array block 12a for avoiding repetition. Although various component units such as address decoding units and a timing generating unit are further fabricated on the silicon chip 11, these component units are less important for understanding the present invention, and, for this reason, are omitted from the drawings.

Figure 1:
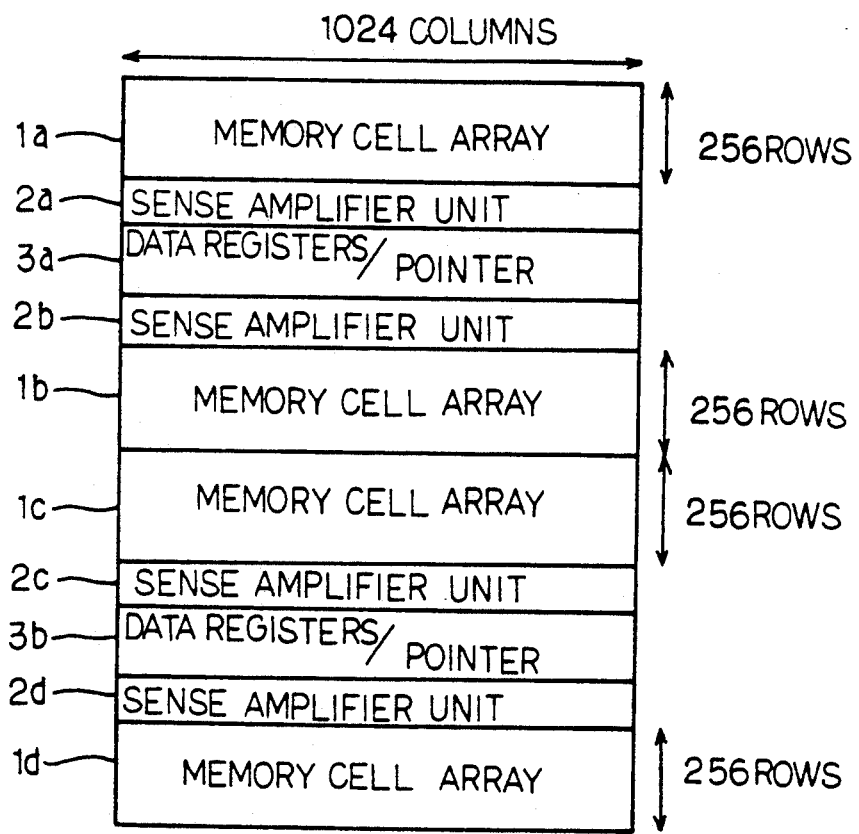
FIG. 1 is a view showing the layout of the prior art dynamic random access memory device.
Figure 2:
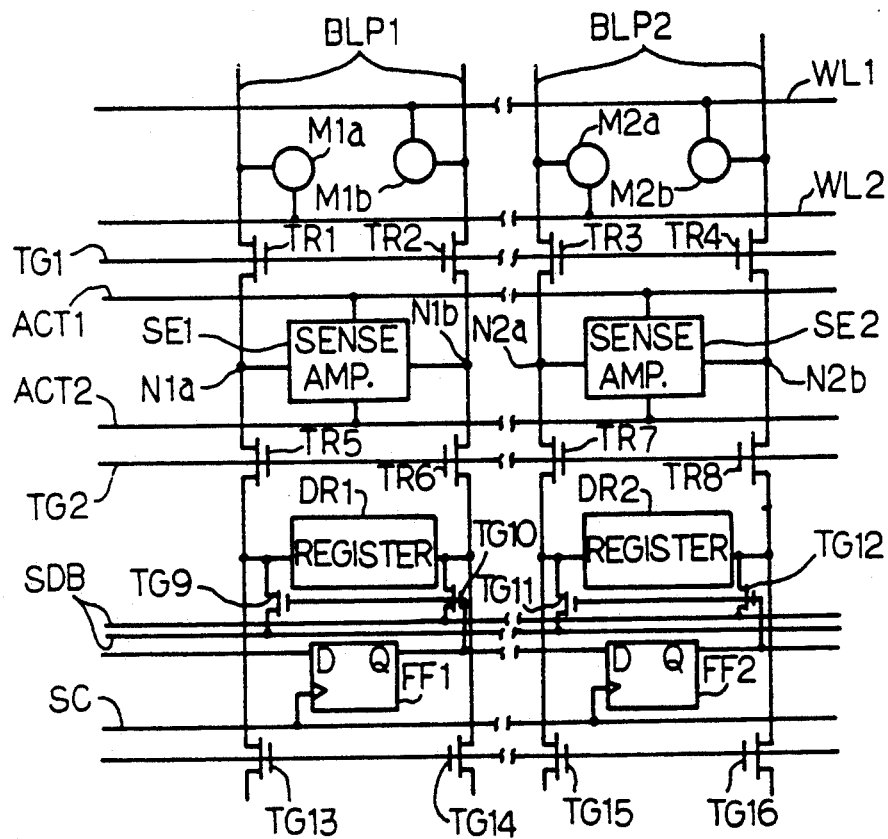
FIG. 2 is a circuit diagram showing the arrangement of the prior art dynamic random access memory device shown in FIG. 1.

The memory cell array block 12a includes four memory cell arrays 13a, 13b, 13c and 13d each implemented by a large number of dynamic random access memory cells arranged in 256 rows and 1024 columns, and each of the dynamic random access memory cells is of the one-transistor and one-capacitor type. Between the memory cell arrays 13a and 13b is provided a sense amplifier unit 14a which is implemented by 1024 sense amplifier circuits respectively associated with the 1024 columns. Similarly, a sense amplifier unit 14b is provided between the memory cell arrays 13c and 13d, and 1024 sense amplifier circuits form in combination another sense amplifier unit 14b. A combined unit 15 of data registers and a pointer is shared between the sense amplifier units 14a and 14b and, accordingly, with the four memory cell arrays 13a to 13d. Comparing the layout according to the present invention with the prior art layout shown in FIG. 1, it will be understood that the sense amplifier units and the combined units are half as many as the corresponding units, and the layout according to the present invention is effective against increase of the occupation area. The combined unit serves as a serial transfer means in this instance.

Figure 4:
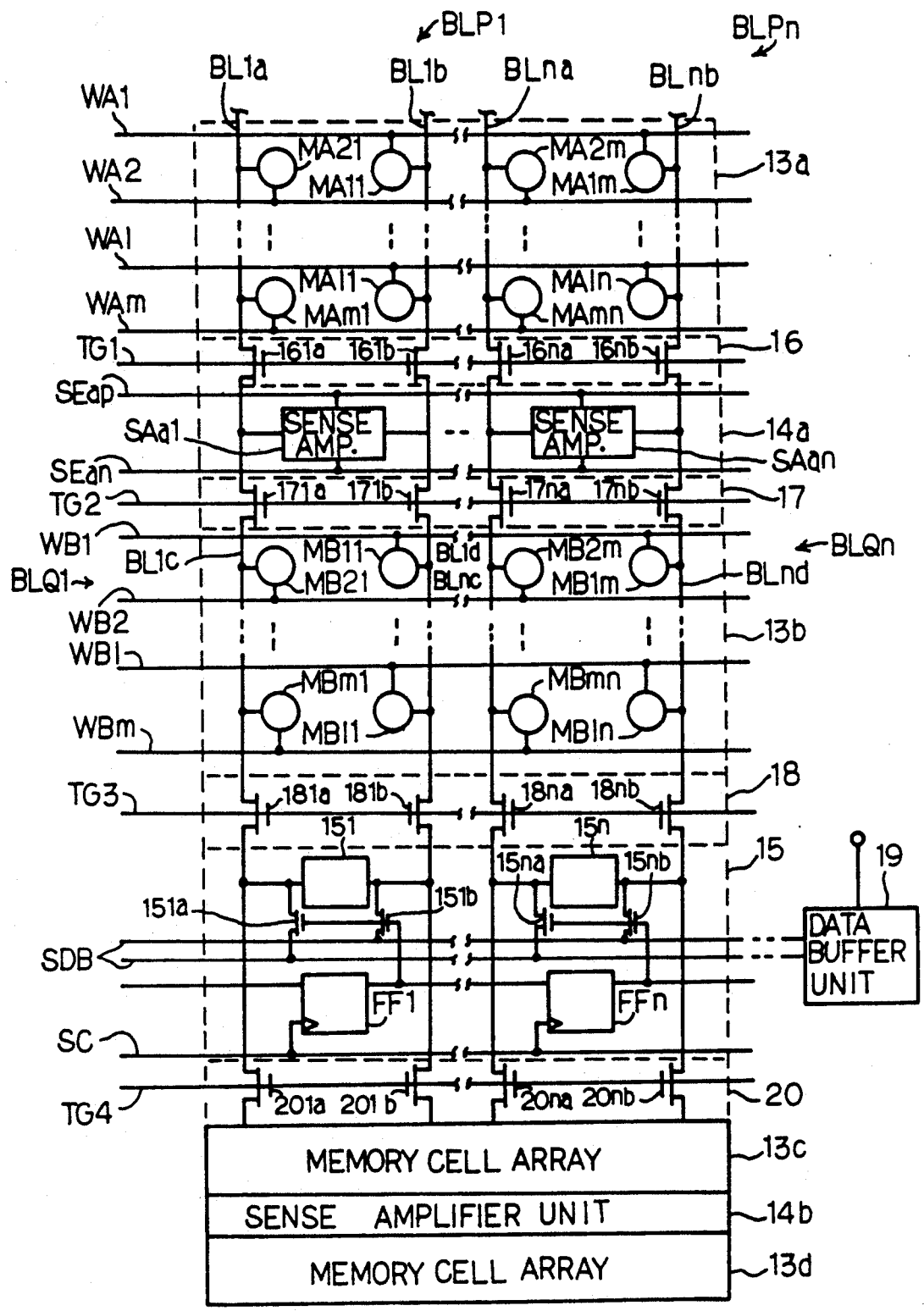
FIG. 4 is a circuit diagram showing the arrangement of a part of the dynamic random access memory device shown in FIG. 3.

Turning to FIG. 4 of the drawings, the circuit arrangement of the memory cell array block 12a is illustrated. The memory cell array 13a is implemented by a large number of dynamic random access memory cells MA11, MA1m, MA21, MA2m, MA11, MAln, MAm1 and MAmn, and the dynamic random access memory cells MA11 to MAmn are selectively activated by word lines WA1, WA2, WA1 and WAm. The dynamic random access memory cells MA11 to MAmn are further coupled with bit lines BL1a, BL1b, BLna and BLnb and the bit lines BL1a to BLna are paired with the bit lines BL1b to BLnb so as to form bit line pairs BLP1 to BLPn. When the memory cells MA11 to MAmn are activated, data bits are read out onto the associated bit lines BL1a to BLnb.

The sense amplifier unit 14a includes a plurality of sense amplifier circuits SAa1 to SAan which are respectively associated with the bit line pairs BLP1 to BLPn. A first transfer gate unit 16 is provided between the memory cell array 13a and the sense amplifier unit 14a, and transfer gates 161a, 161b, 16na and 16nb are coupled between the bit line pairs BLP1 to BLPn and the sense amplifier circuits SAa1 to SAan. Each of the transfer gates 161a to 16nb is implemented by an n-channel enhancement type field effect transistor. The transfer gates 161a to 16nb are responsive to a first gate control signal TG1, and transfer data bits in the form of small difference voltage to the sense amplifier circuits SAa1 to SAan. The sense amplifier circuits SAa1 to SAan are concurrently activated upon coupling with sources of voltage levels through voltage lines SEap and SEan, and increase small differences respectively indicative of the data bits transferred from the bit line pairs BLP1 to BLPn.

A second transfer gate unit 17 is provided between the sense amplifier unit 14a and the memory cell array 13b, and transfer gates 171a, 171b, 17na and 17nb are coupled between the sense amplifier circuits SAa1 to SAan and bit lines BL1c, BL1d, BLnc and BLnd. The bit lines BL1c to BLnc are respectively paired with the bit liens BL1d to BLnd so that bit line pairs BLQ1 to BLQn are provided for the memory cell array 13b. The memory cell array 13b is implemented by memory cells MB11, MB1m, MB21, MB2m, MB11, MB1n, MBm1 and MBmn which are selectively coupled with the bit lines BL1c to BLnd. The memory cells MB11 to MBmn are selectively activated with word lines WB1, WB2, WB1 and WBm, and data bits are read out onto the associated bit liens BL1c to BLnd in the form of small difference voltage. The transfer gates 171a to 17nb are responsive to a second gate control signal TG2, and transfer the data bits on the bit line pairs BLQ1 to BLQn to the sense amplifier circuits SAa1 to SAan, respectively. Since the first and second gate control signals TG1 and TG2 complementarily allow the first and second transfer gate units 16 and 17 to transfer the data bits to the sense amplifier unit 14a, the memory cell arrays 13a and 13b are selectively coupled with the sense amplifier unit 14a, and the sense amplifier unit 14a is shared between the memory cell arrays 13a and 13b.

A third transfer gate unit 18 is further provided between the bit line pairs BLQ1 to BLQn and the combined unit 15, and is implemented by transfer gates 181a, 181b, 18na and 18nb coupled between the bit line pairs BLQ1 to BLQn and data registers 151 to 15n forming parts of the combined unit 15. The transfer gates 181a to 18nb are formed by n-channel enhancement type field effect transistors, respectively. The transfer gates 181a to 18nb are responsive to a third gate control signal TG3, and transfer data bits on the bit line pairs BLQ1 to BLQn to the data registers 151 to 15n. The combined unit 15 further has a pointer implemented by flip-flop circuits FF1 to FFn coupled in cascade, and the flip-flop circuits FF1 to FFn are respectively associated with the data registers 151 to 15n. The data registers 151 to 15n are coupled through transfer gates 151a, 151b, 15na and 15nb with a serial data bus SDB, and the transfer gates 151a to 15nb are sequentially gated by the pointer. Namely, the flip-flop circuits FF1 to FFn are responsive to a clock signal SC, and allow the transfer gates 151a to 15nb to serially transfer data bits between the data registers 151 to 15n and the serial data bus SDB. The serial data bus SDB is coupled with an input/output data buffer unit 19, and propagates data bits from the data registers 151 to 15n to the input/output data buffer unit 19 in a read-out phase of operation and vice versa in a write-in phase of operation. Though not shown in the drawings, a selector unit is coupled between the combined units respectively incorporated in the memory cell array blocks 12a to 12d and the input/output data buffer unit 19, and the input/output data buffer unit 19 is communicable with any one of the combined units.

A fourth transfer gate unit 20 is provided between the combined unit 15 and the memory cell array 13c, and transfer gates 201a, 201b, 20na and 20nb are coupled between the data registers 151 to 15n and the memory cell array 13c. The memory cell array 13c, the sense amplifier unit 14b and the memory cell array 13d are similar in arrangement with the memory cell array 13a, the sense amplifier unit 14a and the memory cell array 13d, and two transfer gate units are coupled between the memory cell array 13c, the sense amplifier unit 14b and the memory cell array 13d. Data bits read-out from either memory cell array 13c or 13d are increased by the sense amplifier unit 14b. The fourth transfer gate unit 20 is responsive to a fourth gate control signal TG4, and transfers data bits read-out from either memory cell array 13c or 13d to the data registers 151 to 15n. For this reason, the combined unit 15 is shared between the sense amplifier units 14a and 14b and, accordingly between the memory cell arrays 13a to 13d.

Figure 5:
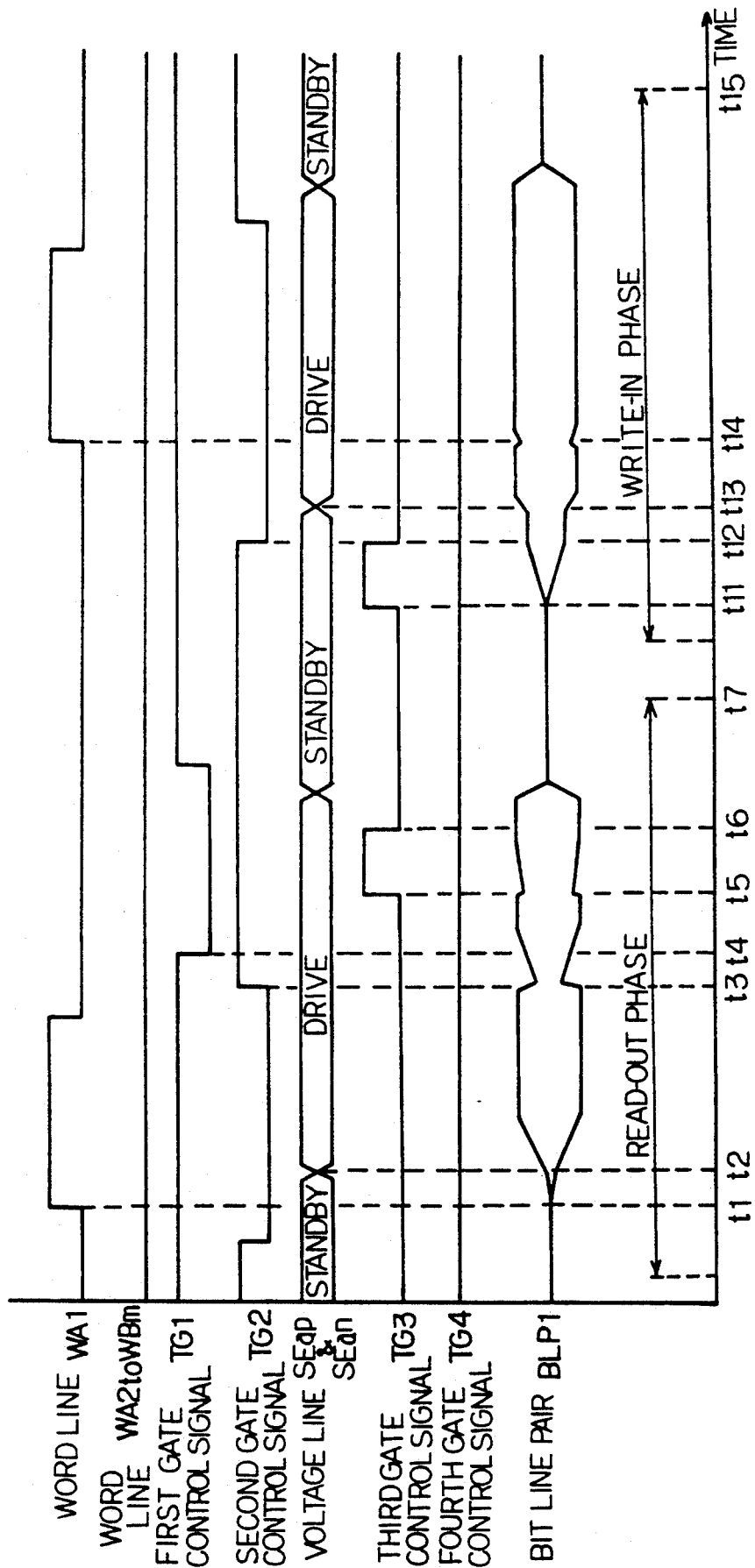
FIG. 5 is a timing chart showing read-out and write-in phases of the dynamic random access memory device.

Description is hereinbelow made on circuit behaviors of the dynamic random access memory device with reference to FIG. 5 of the drawings on the assumption that the memory cells MA11 to MA1n are designated by an external address signal. First, the dynamic random access memory device is assumed to enter the read-out phase of operation. The first gate control signal TG1 is kept in the active high voltage level, and the second gate control signal TG2 remains in the inactive low voltage level. The first transfer gate unit 16 couples the bit line pairs BLP1 to BLPn with the sense amplifier unit 14a, and the second transfer gate unit 17 isolates the sense amplifier unit 14a from the bit line pairs BLQ1 to BLQn. However, the voltage lines SEap and SEan have not activated the sense amplifier circuits SAa1 to SAan yet. The bit line pairs BLP1 to BLPn and BLQ1 to BLQn are precharged by a precharging circuit (not shown) to a neutral level.

If the word line WA1 is lifted to the active high voltage level at time t1, the memory cells MA11 to MA1n are activated so that data bits stored therein produce small difference voltages on the associated bit line pairs BLP1 to BLPn. The bit line pairs BLP1 to BLPn propagate the small difference voltages to the first transfer gate unit 16, and the first transfer gate unit 16 relays the small difference voltages to the sense amplifier circuits SAa1 to SAan. If the voltage lines SEap and SEan couple the sense amplifier circuits SAa1 to SAan with the sources of voltage levels at time t2, the sense amplifier circuits SAa1 to SAan are driven for increasing the small difference voltages, and large difference voltages take place on the bit line pairs BLP1 to BLPn. The large difference voltages are also indicative of the data bits read out from the memory cells MA11 to MA1n, and the data bits are rewritten into the memory cells MA11 to MA1n again.

The second gate control signal TG2 goes up to the active high voltage level at time t3, and the sense amplifier circuits SAa1 to SAan are coupled with the bit line pairs BLQ1 to BLQn. Although the large difference voltage levels are transiently decreased due to parasitic capacitances coupled with the bit line pairs BLQ1 to BLQn, the sense amplifier circuits SAa1 to SAan develop the large difference voltages again. The first gate control signal TG1 is recovered to the inactive low voltage level at time t4, and the sense amplifier circuits SAa1 to SAan are isolated from the bit line pairs BLP1 to BLPn. If the third gate control signal TG3 is lifted to the active high voltage level at time t5, the large differences are transferred to the data registers 151 to 15n, and the data bits read out from the memory cells MA11 to MA1n are temporality stored therein. The third gate control signal TG3 is recovered to the inactive low voltage level at time t6 again, and the data registers 151 to 15n are isolated from the bit line pairs BLQ1 to BLQn and, accordingly, from the sense amplifier unit 14a.

The clock signal SC causes the pointer to sequentially designate the flip-flop circuits FF1 to FFn, and the data registers 151 to 15n are sequentially coupled with the serial data bus SDB through the associated transfer gates 151a to 15nb. For this reason, the data bits read out from the memory cells MA11 to MA1n are serially supplied to the input/output data buffer unit 19, and the input/output data buffer unit 19 produces an output data signal indicative of the data bits stored in the memory cells MA11 to MA1n. All of the signals are recovered to the respective initial voltage level until time t7, and the read-out phase of operation is completed. In the write-in phase of operation, the bit line pairs BLP1 to BLPn as well as BLQ1 to BLQn are precharged to the neutral level, and write-in data bits are serially supplied from the input/output data buffer unit 19 to the serial data bus SDB. The clock signal SC causes the pointer to sequentially designate the data registers 151 to 15n, and the write-in data bits are stored in the data registers 151 to 15n, respectively. The first and second gate control signals TG1 and TG2 allow the first and second transfer gate units 16 and 17 to couple the sense amplifier unit 14a with the bit line pairs BLP1 to BLPn and BLQ1 to BLQn. The third gate control signal TG3 is lifted up to the active high voltage level at time t11, and the data registers 151 to 15n are respectively conducted to the sense amplifier circuits SAa1 to SAan and the bit line pairs BLQ1 to BLQn and BLP1 to BLPn. Small difference voltages indicative of the write-in data bits take place on the bit line pairs BLP1 to BLPn. The second and third gate control signals TG2 and TG3 are decayed at time t12, and the sense amplifier circuits SAa1 to SAan are isolated from the data registers 151 to 15n as well as the bit line pairs BLQ1 to BLQn. The voltage lines SEap and SEan activate the sense amplifier circuits SAa1 to SAan at time t13, and the sense amplifier circuits SAa1 to San drive the bit line pairs BLP1 to BLPn so that the small difference voltages are increased. The word line WA1 is lifted to the active high voltage level at time t14, and the large difference voltages indicative of the write-in data bits are written into the memory cells MA11 to MA1n. All of the signals are recovered to the initial levels until time t15, and the write-in phase of operation is completed.

However, the fourth gate control signal TG4 remains in the inactive low voltage level over the read-out phase as well as over the write-in phase, and, for this reason, the memory cell arrays 13c and 13d are isolated from the combined unit 15.

As will be appreciated from the foregoing description, the layout according to the present invention effectively decreases the occupation area, and enhances the production yield.

Although particular embodiments of the present invention have been shown and described, it will be obvious to those skilled in the art that various changes and modifications may be made without departing from the spirit and scope of the present invention. For example, the layout according to the present invention is applicable to any kind of semiconductor memory device equipped with sense amplifier circuits and serial data buffer circuits. Moreover, the combined unit or the serial transfer means may be associated with either input or output data buffer unit.

What is claimed is:

1. A semiconductor memory device fabricated on a single semiconductor chip, comprising:
    a) a plurality of memory cell arrays each having a plurality of memory cells respectively storing data bits;
    b) a plurality of sense amplifier units each shared between two memory cell arrays selected from said plurality of memory cell arrays, and operative to increase small difference voltages representative of the data bits; and
    c) at least one serial data transfer means shared between two sense amplifier units selected from said plurality of sense amplifier units for serially transferring said data bits between one of said two sense amplifier units and a data buffer unit.

2. A semiconductor memory device as set forth in claim 1, in which said at least one serial data transfer means comprises c-1) data registers for temporarily storing said data bits, c-2) a plurality of flip flop circuits coupled in cascade for forming a pointer and sequentially designating said data registers, and c-3) transfer gates coupled between said data registers and a serial data bus connectable with said data buffer unit and responsive to an output signal of said pointer for serially transferring said data bits between said data registers and said serial data bus.

3. A semiconductor memory device as set forth in claim 1, in which said semiconductor memory device further comprises d) a plurality of first bit line pairs coupled with one of said memory cell arrays for propagating said data bits, e) a plurality of second bit line pairs coupled with another of said memory cell arrays for propagating said data bits, f) a first transfer gate unit coupled between said plurality of first bit line pairs and one of said sense amplifier units and responsive to a first gate control signal for interconnecting said plurality of first bit line pairs and said one of said sense amplifier units, g) a second transfer gate unit coupled between said plurality of second bit line pairs and said one of said sense amplifier units and responsive to a second gate control signal for interconnecting said plurality of second bit line pairs and said one of said sense amplifier units, h) a third transfer gate unit coupled between said plurality of second bit line pairs and said at least one serial data transfer means and responsive to a third gate control signal for interconnecting said at least one serial data transfer means and said plurality of second bit line pairs, and i) a fourth transfer gate unit coupled between said at least one serial data transfer means and others of said memory cell arrays provided in association with another of said sense amplifier units and responsive to a fourth gate control signal for interconnecting said others of said memory cell arrays and said at least one serial data transfer means.

4. A semiconductor memory device as set forth in claim 3, in which said memory cells are dynamic random access memory cells.

5. A semiconductor memory device as set forth in claim 4, in which said semiconductor memory device selectively enters a read-out phase and a write-in phase of operation.

6. A semiconductor memory device as set forth in claim 5, in which said data buffer unit is an output data buffer unit, and in which said read-out phase of operation has first, second and third sub-phases, said first and second gate control signals complementarily entering an active level and an inactive level in said first and second sub-phases so that said plurality of first bit line pairs or said plurality of second bit line pairs are coupled with said one of said sense amplifier units, said third and fourth gate control signals complementarily entering an active level and an inactive level in said third sub-phase so that said serial data transfer means is coupled with said one of said sense amplifier units or said another of said sense amplifier unit.

7. A semiconductor memory device as set forth in claim 6, in which said data buffer unit is an input data buffer unit, and in which said write-in phase of operation has fourth and fifth sub-phases, said first to fourth gate control signals being controlled in such a manner that said data bits stored in said at least one serial data transfer means are supplied to a predetermined sense amplifier unit selected from said plurality of sense amplifier units and to a predetermined memory cell array selected from said plurality of memory cell arrays in said fourth sub-phase, said first to fourth gate control signals being controlled in such a manner that said predetermined sense amplifier unit and said predetermined memory cell array are conducted to each other and isolated from said at least one serial data transfer means and from others of said memory cell arrays.

* * * * *

UNITED STATES PATENT AND TRADEMARK OFFICE
CERTIFICATE OF CORRECTION

PATENT NO. : 5,235,547
DATED : Aug. 10, 1993
INVENTOR(S) : Shotaro KOBAYASHI It is certified that error appears in the above-identified patent and that said Letters Patent is hereby corrected as shown below:

Col. 4, line 38, after "unit", insert --15--;

Col. 4, line 44, delete "MA11" (second occurrence) and insert --MA11--.

Col. 5, line 12, delete "liens" and insert --lines--;

Column 5, line 15, delete "MB11" (second occurrence) and insert --MB11--.

Signed and Sealed this

Fourteenth Day of June, 1994

*Attest:*

BRUCE LEHMAN

*Attesting Officer*     *Commissioner of Patents and Trademarks*